US 6,566,226 B2

(12) United States Patent
Hatanaka

(10) Patent No.: US 6,566,226 B2
(45) Date of Patent: May 20, 2003

(54) SEMICONDUCTOR DEVICE AND FABRICATION PROCESS THEREOF, METHOD OF FORMING A DEVICE ISOLATION STRUCTURE

(75) Inventor: Masanobu Hatanaka, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/883,233

(22) Filed: Jun. 19, 2001

(65) Prior Publication Data
US 2001/0042896 A1 Nov. 22, 2001

Related U.S. Application Data

(63) Continuation of application No. PCT/JP99/07256, filed on Dec. 24, 1999.

(30) Foreign Application Priority Data

Dec. 25, 1998 (JP) .............................. 10-371049

(51) Int. Cl.[7] .............................................. H01L 21/76
(52) U.S. Cl. ...................... 438/430; 438/431; 438/432; 257/505; 257/510; 257/520
(58) Field of Search ................................. 438/430, 431, 438/432; 257/505, 510, 520

(56) References Cited

U.S. PATENT DOCUMENTS

| 4,611,386 A | * | 9/1986 | Goto .......................... 257/517 |
| 5,455,194 A | * | 10/1995 | Vasquez et al. ...... 148/DIG. 50 |
| 6,010,947 A | * | 1/2000 | Kondo ................. 148/DIG. 50 |
| 6,040,232 A | * | 3/2000 | Gau ........................... 438/424 |
| 6,074,932 A | * | 6/2000 | Wu ............................. 438/296 |
| 6,143,623 A | * | 11/2000 | Tsuda et al. .......... 148/DIG. 50 |
| 6,153,478 A | * | 11/2000 | Lin et al. ..................... 438/296 |

FOREIGN PATENT DOCUMENTS

| JP | 60-753 | 1/1985 |
| JP | 62-214638 | 9/1987 |
| JP | 1-260840 | 10/1989 |
| JP | 6-85051 | 3/1994 |

* cited by examiner

Primary Examiner—Trung Dang
(74) Attorney, Agent, or Firm—Armstrong, Westerman & Hattori, LLP

(57) ABSTRACT

In a semiconductor device having an STI structure, a space is formed by causing a recession in an oxide film on a surface of a substrate with regard to a sidewall surface of a device isolation trench at an edge of the device isolation trench, and a Si film is formed so as to fill the trench. Further, the oxide film is removed from the surface of the substrate while leaving the Si film, and the trench is filled with an oxide film. Further, the Si film is oxidized to form an oxide film forming a part of the oxide film.

11 Claims, 11 Drawing Sheets

SEMICONDUCTOR DEVICE AND FABRICATION PROCESS THEREOF, METHOD OF FORMING A DEVICE ISOLATION STRUCTURE

This application is a continuation of international application PCT/JP99/07256 filed on Dec. 24, 1999.

TECHNICAL FIELD

The present invention generally relates to semiconductor devices, and more particularly to a semiconductor device having a shallow trench device isolation (STI) structure and a fabrication process thereof.

In semiconductor integrated circuit devices, a so-called device isolation structure is used for isolating a plurality of device regions formed on a common semiconductor substrate from each other electrically.

In conventional semiconductor integrated circuit devices, a field oxide film formed by a so-called LOCOS process has been used for such a device isolation structure. On the other hand, a field oxide film has a tendency of having an increased area as compared with an area of a device region due to the formation of bird's beak structure that penetrates into the device region and is problematic in view of miniaturization of semiconductor integrated circuit device. Thus, recent semiconductor integrated circuit devices using semiconductor devices of sub-micron size or sub-half-micron size tend to use less area-occupying shallow-trench device isolation (STI) structures, in place of conventional field oxide films.

BACKGROUND ART

FIG. 1 shows the construction of a semiconductor device 10 having an STI structure according to a related art of the present invention.

Referring to FIG. 1, the semiconductor device 10 is formed on a device region defined on a p-type Si substrate 11 by a device isolation region 12 having the STI structure, and n-type diffusion regions 11a–11c having an LDD structure are formed in the Si substrate 11 in correspondence to the device region. The device region is further covered by a gate oxide film 13 and a gate electrode 14A of a first MOS transistor is formed on the gate oxide film 13 in correspondence to the channel region between the diffusion regions 11a and 11b. Further, a gate electrode 14B of a second MOS transistor is formed in correspondence to the channel region between the diffusion regions 11b and 11c.

Each of the gate electrodes 14A and 14B is covered by a pair of sidewall oxide films and further by an interlayer insulation film 15. Further, the interlayer insulation film 15 is formed with contact holes 15A–15C respectively exposing the diffusion regions 11a–11c, and the contact holes 15A–15C are filled by polysilicon electrodes 16A–16C, respectively.

As can be seen from FIG. 1, the device isolation region 12 of the STI structure is formed of device isolation trenches 11A and 11B each formed in the Si substrate 11 and an $SiO_2$ film filling the device isolation trenches 11A and 11B and forming the region 12. Thus, the device isolation region 12 does not form a bird's beak structure and the area of the device isolation region can be minimized.

FIG. 2 shows the cross section of the semiconductor device 10 of FIG. 1 taken in a direction perpendicular to the cross-section of FIG. 1 taken along the gate electrode 14A. In FIG. 2, the representation of the interlayer insulation film 15 or the electrodes 16A and 16B is omitted. Further, the illustration of the sidewall oxide film of the gate electrode 14A is omitted.

Referring to FIG. 2, the $SiO_2$ film forming the STI structure is formed with a depression along the boundary to the Si substrate 11 associated with the etching of a pad oxide film on the Si substrate 11, and it can be seen that the $SiO_2$ film forms an edge having an acute angle in such a depression. As a result of the existence of such an edge of acute angle, there is caused a concentration of electric field in the $SiO_2$ film when a gate voltage is applied to the gate electrode 14A and there arises a problem that the threshold voltage of the MOS transistor having the gate electrode 14A is reduced effectively in the vicinity of the edge of the acute angle.

When such a decrease of the effective threshold voltage is caused, the MOS transistor starts to conduct at a gate voltage below the desired threshold voltage as represented in the drain current Id—gate voltage Vg characteristic curve of FIG. 3, and there appears a kink in the characteristic curve in which the drain current increases sharply with the increase of the gate voltage.

Further, in such a structure, due to the formation of the depression in the $SiO_2$ film 12, there can be a case, when forming the gate electrode 14A or 14B by patterning a polysilicon or amorphous silicon, in that an etching residue of polysilicon or amorphous silicon remains in such a depression and causes problems such as short circuit.

In order to avoid the kink of the characteristic curve caused by the electric field concentration in the edge part of the STI structure, there is proposed an STI structure formed according to the process of FIGS. 4A–4D in another related art of the present invention.

Referring to FIG. 4A, an initial oxide film 23 and a hand mask layer 24 of an SiN film are formed consecutively on a Si substrate 21 and an $SiO_2$ film 25 is formed further on the SiN film 24 by a high-temperature CVD process. Further, an opening 26 is formed through the films 23–25 so as to expose the Si substrate 21.

Next, in the step of FIG. 4B, the structure of FIG. 4A is oxidized in a wet atmosphere and a minute LOCOS 27 is formed in correspondence to the opening 26. Further, a sidewall oxide film 25A is formed on the sidewall of the opening 26.

Further, in the step of FIG. 4C, the minute LOCOS 27 is subjected to a dry etching process while using the SiN film 24 and the sidewall oxide film 25A as a mask, to form a trench 21A so as to reach the Si substrate 21. Further, the trench 21A is filled with an $SiO_2$ film and subsequently applied with an etch back process, and the SiN film 24 is removed. Further, a sidewall oxide film 28A is formed outside the $SiO_2$ film thus formed, as represented in FIG. 4D.

In such an STI structure, no edge part having an acute angle is formed between the Si substrate 21 and the trench 21A and the problem of decrease of the threshold voltage of the MOS transistor caused by concentration of electric field is avoided.

However, the STI structure having such a construction requires a complex fabricating process and increases the cost of fabrication.

In a further related art of the present invention, there is proposed an STI structure that avoids the problem of electric field concentration with a simpler construction as represented in FIG. 5.

Referring to FIG. 5, a trench 31A is formed in an Si substrate 31 and the trench 31A is filled with an $SiO_2$ film 32. Further, sidewall insulation films 33 are formed at both lateral sides of a projecting part of the $SiO_2$ film 32 on the substrate 31 by a deposition and etch-back of an $SiO_2$ film.

The foregoing process, while being able to form the STI structure by a simple process, has a drawback in that the surface of the Si substrate 31 tends to be contaminated by impurities in relation to the etch-back process of the $SiO_2$ film.

DISCLOSURE OF THE INVENTION

Accordingly, it is a general object of the present invention to provide a novel and useful semiconductor device and a fabrication process thereof wherein the foregoing problems are eliminated.

Another and more specific object of the present invention is to provide a semiconductor device having an STI structure and is capable of avoiding the concentration of electric field at the edge part of the STI structure effectively and a fabrication process thereof.

Another object of the present invention is to provide a semiconductor device, comprising:

a substrate; and a device isolation structure formed on said substrate for defining a device region, said device isolation structure comprising:
a trench formed in said substrate; and
an insulating film filling said trench, said insulating film including an extension part extending outwardly from an outer edge of said trench on a surface of said substrate, and a projecting part projecting upwardly from said extension part in correspondence to said outer edge of said trench.

Another object of the present invention is to provide a method of fabricating a semiconductor device having a shallow trench device isolation structure, comprising the steps of:

forming a first oxide film on a Si substrate;

forming a polishing stopper layer on said first oxide film;

forming a trench through said polishing stopper layer and further through said first oxide film such that said trench reaches said Si substrate;

etching said first oxide film exposed at said trench to as to cause a recession in a sidewall surface of said first oxide film with respect to a sidewall surface of said trench, such that there is formed a space between a top surface of said Si substrate and a bottom surface of said polishing stopper layer such that said space is opened at said sidewall of said trench;

oxidizing said sidewall surface and a bottom surface of said trench to form a second oxide film such that said second oxide film covers said top surface of said Si substrate exposed by said space in continuation with said first oxide film;

depositing a Si film on said polishing stopper layer such that said Si film covers said second oxide film and such that said Si film fills said space;

depositing a third oxide film on said Si film so as to fill said trench;

removing said third oxide film and said Si film underlying said third oxide film by a chemical mechanical polishing process while using said polishing stopper layer as a stopper;

removing said polishing stopper layer and said first oxide film from said top surface of said Si substrate; and oxidizing said Si film.

Another object of the present invention is to provide a method of fabricating a semiconductor device having a shallow trench device isolation structure, comprising the steps of:

forming a first oxide film on a Si substrate;

forming a polishing stopper layer on said first oxide film;

forming a trench through said polishing stopper layer and further through said first oxide film underneath said polishing stopper layer such that said trench reaches said Si substrate;

etching said first oxide film exposed at said trench so as to cause a recession of a sidewall surface of said first oxide film with respect to a sidewall surface of said trench, such that there is formed a space between a top surface of said Si substrate and a bottom surface of said polishing stopper such that said space is opened at said sidewall surface of said trench;

oxidizing said sidewall surface and a bottom surface of said trench to form a second oxide film such that said second oxide film covers said sidewall surface and said bottom surface of said trench and said top surface of said Si substrate exposed by said space in continuation with said first oxide surface;

forming a Si film in said trench such that said Si film fills said space;

depositing a third oxide film so as to fill said trench;

removing said third oxide film by a chemical mechanical polishing process while using said polishing layer as a stopper;

removing said polishing stopper layer and said first oxide film from said top surface of said Si substrate; and oxidizing said Si film.

Another object of the present invention is to provide a method of fabricating a semiconductor device comprising a device isolation trench formed in a substrate and an insulating film filling said device isolation trench, comprising the steps of:

causing a recession in an oxide film formed on a surface of said substrate with regard to a sidewall surface of said device isolation trench at an edge of said device isolation trench, to form a space;

forming a Si film so as to fill said space;

removing said oxide film from said surface of said substrate while leaving said Si film;

filling said trench by an oxide film; and oxidizing said Si film to form an oxide film as a part of said oxide film.

Another object of the present invention is to provide a method of forming a device isolation structure comprising a device isolation trench formed in a substrate and an insulating film filling said device isolation trench, said method comprising the steps of:

causing a recession in an oxide film formed on a surface of said substrate with respect to a sidewall surface of said device isolation trench at an edge of said device isolation trench, to form a space;

forming a Si film so as to fill said space;

removing said oxide film from said top surface of said substrate while leaving said Si film;

filling said trench by an oxide film; and oxidizing said Si film to form an oxide film as a part of said oxide film.

According to the present invention, in a semiconductor device having an STI structure, the device isolation trench constituting the STI structure is filled by an $SiO_2$ film such that the $SiO_2$ film extends over the surface of the substrate to an outer side of the device isolation trench and such that the $SiO_2$ film projects slightly in the upward direction from the substrate surface. By doing so, no acute angle part is formed in the $SiO_2$ film. Thus, there occurs no electric field concentration in the $SiO_2$ film even when a gate electrode extends over the $SiO_2$ film and the problem of change of the threshold voltage is avoided. Further, the present invention does not include a dry etching process for etching back the substrate surface, and thus, there occurs no problem of contamination of the substrate surface by impurities. Further, the $SiO_2$ film has an upwardly convex shape in the device isolation trench, and the problem of residue formation of polysilicon pattern or amorphous silicon pattern in the depressed part of the $SiO_2$ film, which tends to appear in a conventional STI structure, is eliminated.

BEST MODE FOR IMPLEMENTING THE INVENTION

[First Embodiment]

FIGS. 6A–6E show the fabrication process of a semiconductor device having an STI structure according to a first embodiment of the present invention.

Figure 6A:
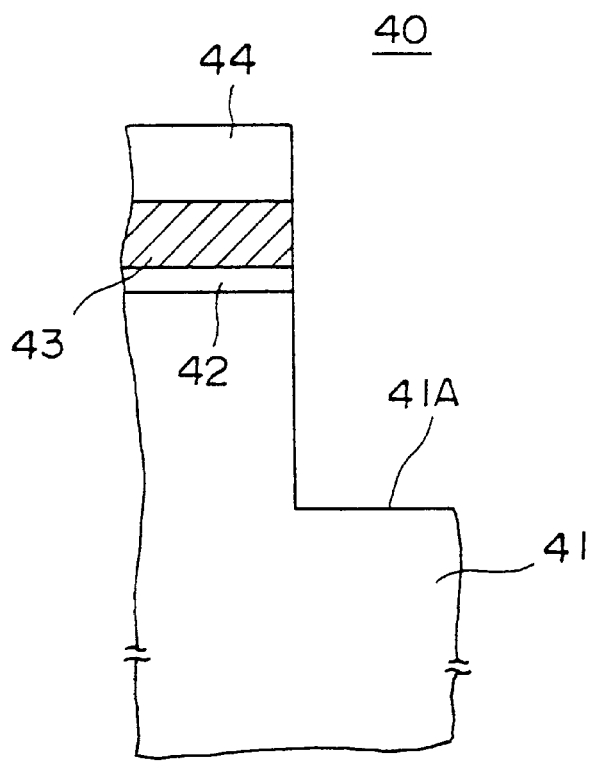
FIGS. 6A–6E are diagrams showing the fabrication process of a semiconductor device according to a first embodiment of the present invention.

Referring to FIG. 6A, an initial oxide film 42 is formed on a Si substrate 41 by a thermal oxidation process with a thickness of 5–200 nm, preferably 10–45 nm, and an SIN film 43 is formed thereon by a pyrolytic CVD process with a thickness of 50–300 nm, preferably 80–200 nm. Further, an $SiO_2$ film 44 is formed on the SIN film 43 in the illustrated example as a hard mask layer, with a thickness of 10–150 nm by a pyrolytic CVD process.

In the step of FIG. 6A, the $SiO_2$ film 44 is further patterned by a dry etching process that uses a resist mask, and the patterned $SiO_2$ film 44 is used as a mask and the SiN film 43 and the underlying initial oxide film 42 are patterned consecutively. By continuing the dry etching process, a device isolation trench 41A is formed in the Si substrate 41 with a depth of 200–400 nm, preferably about 400 nm.

Of course, the device isolation trench 41A may be formed by a dry etching process that uses only a resist pattern as a mask or may be formed by a dry etching process that uses the SiN film 43 as a hard mask.

Figure 6B:
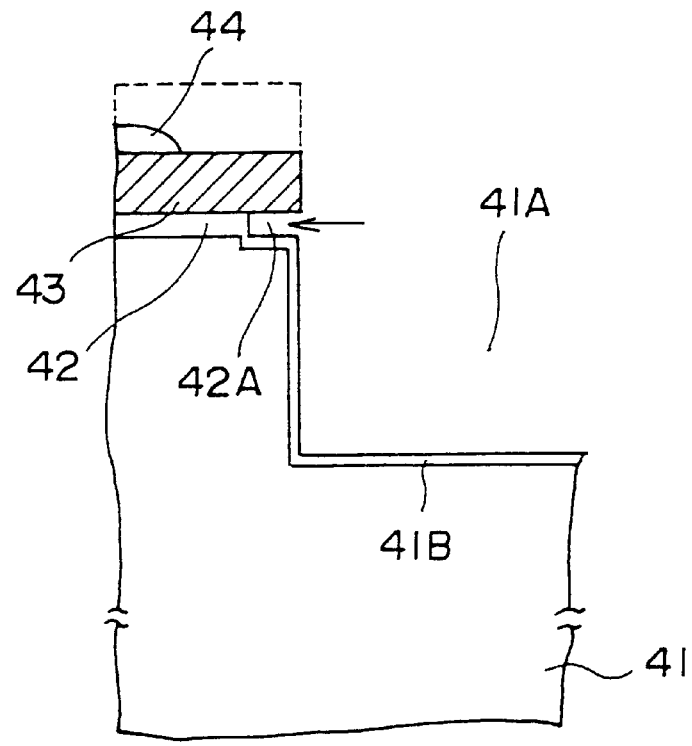

Next, the structure of FIG. 6A is processed in HF in the step of FIG. 6B, wherein the initial oxide film 42 is laterally wet etched as indicated by an arrow in FIG. 6B. As a result of such a wet etching process, the initial oxide film 42 experiences a recession with a magnitude of 5–200 nm, preferably 10–50 nm, and there is formed a space 42A between the top surface of the Si substrate 41 and the bottom surface of the SiN film 43 such that the space 42A opens at the trench 41A. In the step of FIG. 6B, the Si substrate 41 is further applied with a thermal oxidation process and a thermal oxide film 41B is formed so as to cover the bottom surface and sidewall surface of the trench 41A with a thickness of 3–50 nm, preferably about 10 nm. The thermal oxide film 41B is formed so as to cover the surface of the Si substrate 41 also in the space 42A and continues to the initial oxide film 42.

In FIG. 6B, it can be seen that the oxide film 44 also experiences a reduction of area as a result of the wet etching process in HF.

Figure 6C:
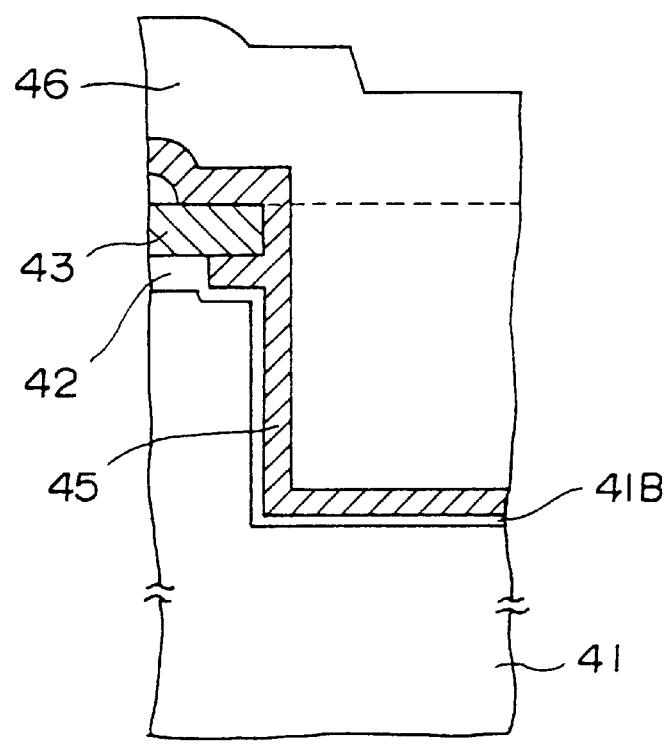

Next, in the step of FIG. 6C, a Si film 45 of polysilicon or amorphous silicon is formed on the structure of FIG. 6B by a pyrolytic CVD process or a plasma CVD process with a thickness of 5–150 nm so as to fill the space 42A. Thereby, the Si film 45 is deposited so as to cover the thermal oxide film 41B on the bottom surface and side surface of the trench 41A. The polysilicon or amorphous silicon is doped with an impurity such as B or P. In the case the initial oxide film 42 has a thickness of 15 nm, it is preferable to set the thickness of the Si film 45 to be 5 nm or more. In the case the initial oxide film 42 has a thickness of 30 nm, it is preferable to form the Si film 45 to have a thickness of 15 nm.

In the step of FIG. 6C, an $SiO_2$ film 46 is formed by a pyrolytic CVD process or plasma CVD process so as to fill up the trench 41A. In the case the $SiO_2$ film 46 is formed by a pyrolytic CVD process, it is preferable to use an organic silane such as TEOS as a gaseous source. In the case the $SiO_2$ film 46 is formed by a plasma CVD process, it is preferable to conduct the plasma CVD process while using a high-density plasma CVD apparatus such as ICP or ECR type with a substrate biasing. Typically, the $SiO_2$ film is formed with a thickness of about 700 nm.

Figure 6D:
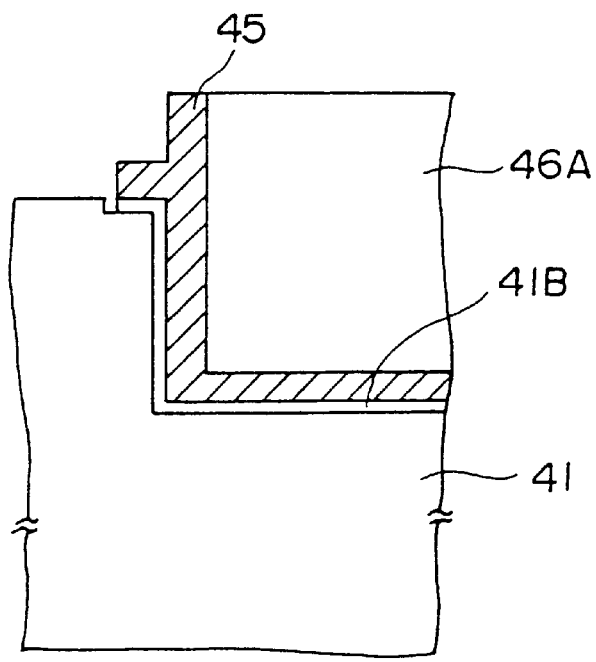

Next, in the step of FIG. 6C, the region above the SiN film 43 represented by a dotted line in the drawing is removed by a chemical mechanical polishing (CMP) process, and the SiN film 43 and the underlying initial oxide film 42 are removed in the step of FIG. 6D from the surface of the Si substrate 41 by a pyrolytic phosphoric acid solution and an HF aqueous solution, respectively.

Figure 6E:
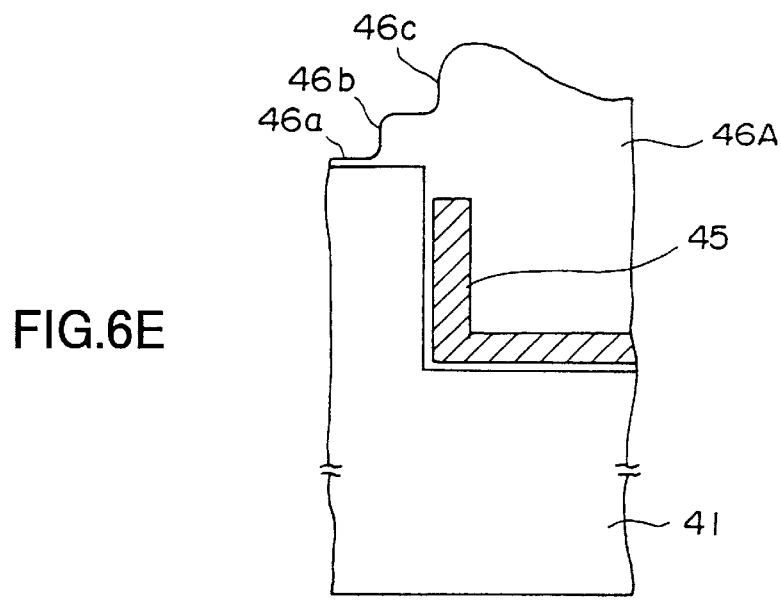

Further, in the step of FIG. 6E, the structure of FIG. 6D is applied with a thermal treatment in an atmosphere of $O_2$+HCl at the temperature of 900° C. or in a dry oxygen atmosphere at the temperature of 1000° C., wherein the exposed part of the Si film 45 is oxidized selectively. Thereby, an oxide film structure unitary to the $SiO_2$ film 46A is formed in correspondence to the stepped parts 46b and 46c. Further, an oxide film 46a is formed on the Si substrate 41 as a result of the oxidation process in continuation to the $SiO_2$ film 46A. The stepped part 46b extends in an outward direction from the trench 41B while the stepped part 46c extends in the upward direction.

In the structure of FIG. 6E, a polysilicon pattern 45 is formed in the trench 41A in the state that the polysilicon pattern 45 is embedded in the oxide film 46A.

Figure 7:
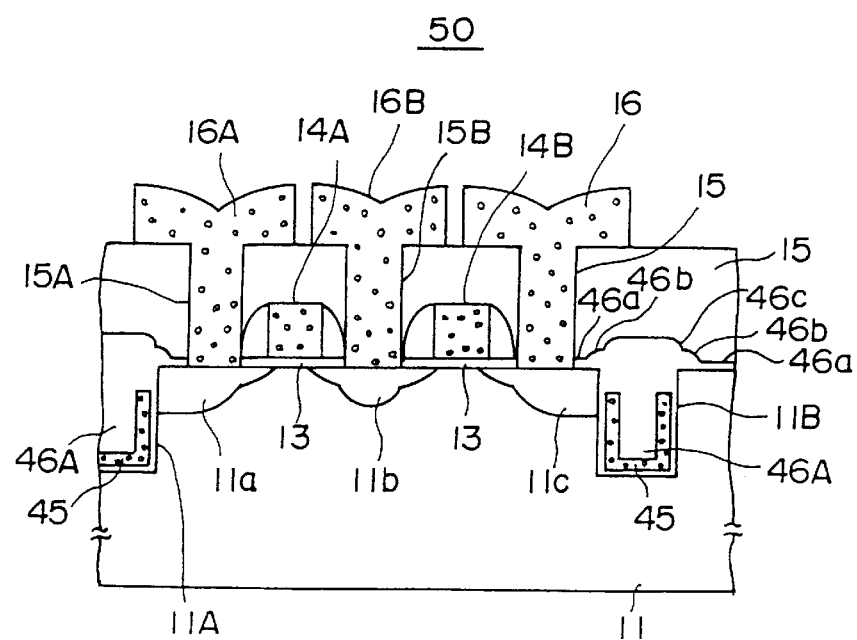
FIG. 7 is a diagram showing the construction of a semiconductor device of the first embodiment of the present invention.

FIG. 7 shows the construction of a semiconductor device 50 that uses the STI structure of FIG. 6E, wherein those parts of FIG. 7 explained before are designated by the same reference numerals and the description thereof will be omitted.

Figure 1:
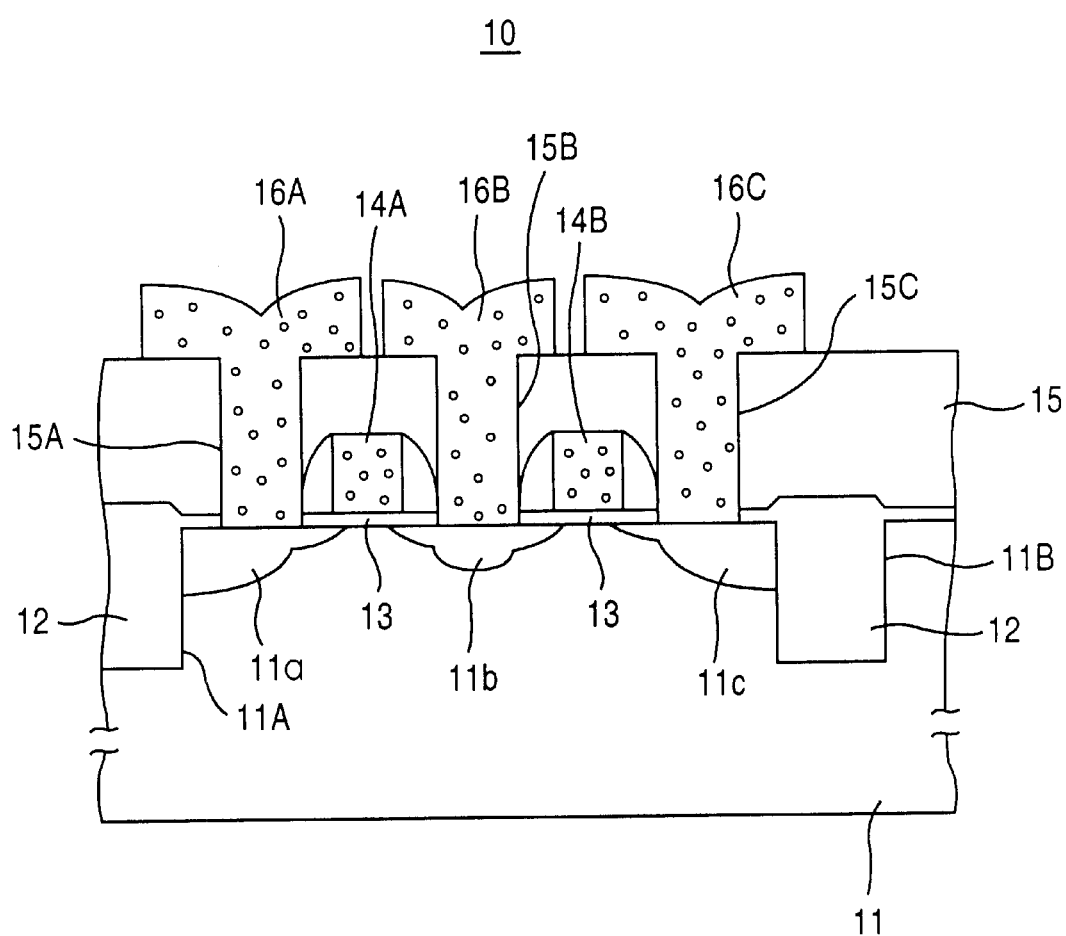
FIG. 1 is a diagram showing the construction of a semiconductor device having an STI structure according to a related art of the present invention.

Referring to FIG. 7, the semiconductor device 50 has a construction similar to that of the semiconductor device 10 of FIG. 1 except that the STI structure including the oxide film 46A that has the stepped parts 46b and 46c explained with reference to FIG. 6E is used in place of the STI structure 12. It should be noted that the stepped part 46b is formed outer side of the device isolation trench while the stepped part 46c is formed at the inner side thereof in correspondence to the sidewall surface of the device isolation trench.

Figure 2:
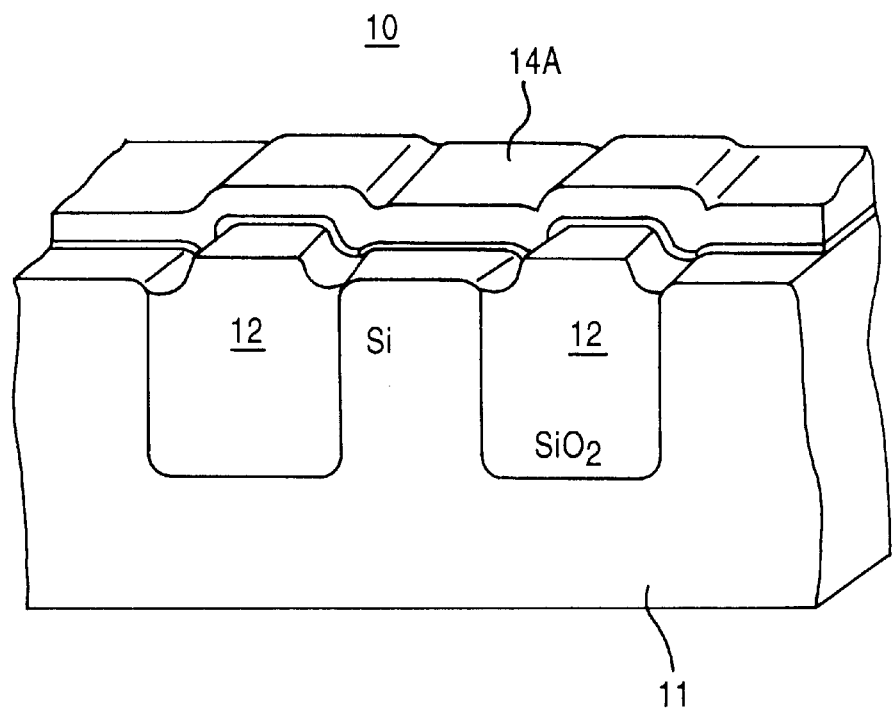
FIG. 2 is a diagram showing a part of the semiconductor device of FIG. 1 in an enlarged scale.
Figure 8:
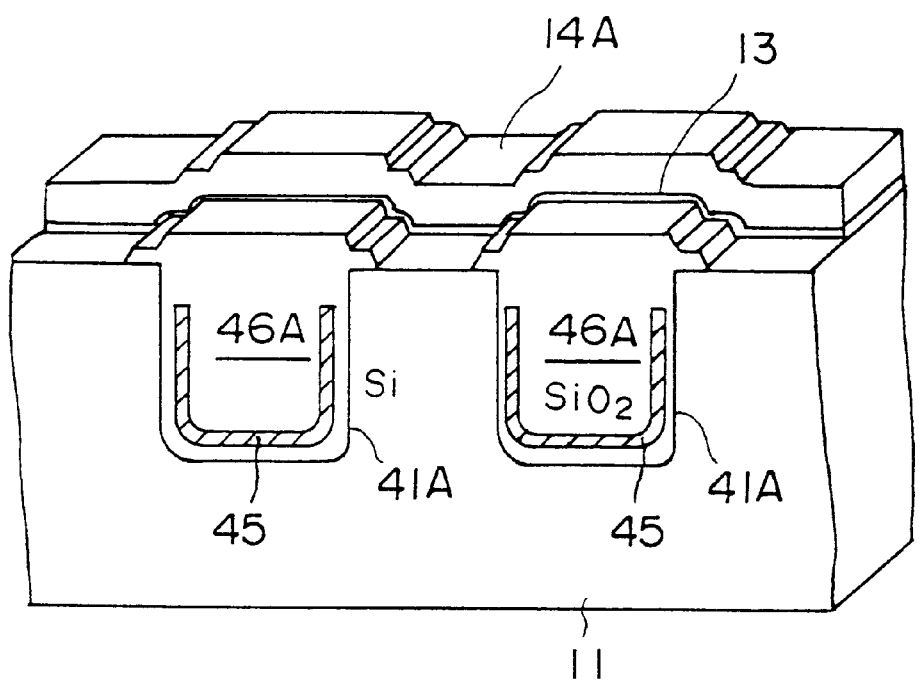
FIG. 8 is a diagram showing a part of the semiconductor device of FIG. 7 in an enlarged scale.

FIG. 8 is a diagram corresponding to FIG. 2 and shows a part of the structure of FIG. 7 in an enlarged scale.

Figure 3:
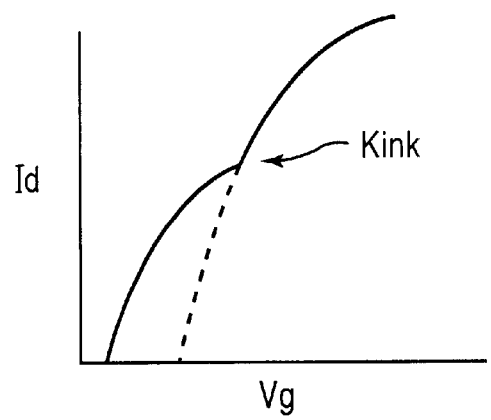
FIG. 3 is a diagram explaining the problem of the semiconductor device of FIG. 1.
Figure 4A:
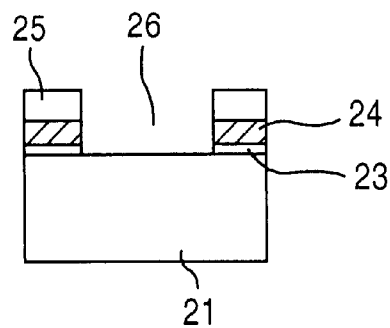
FIGS. 4A–4D are diagrams showing the method of forming an STI structure according to another related art.
Figure 4B:
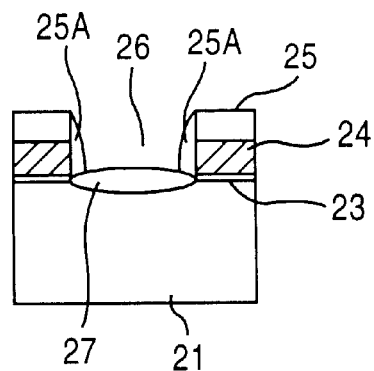
Figure 4C:
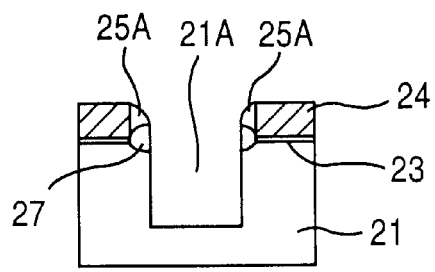
Figure 4D:
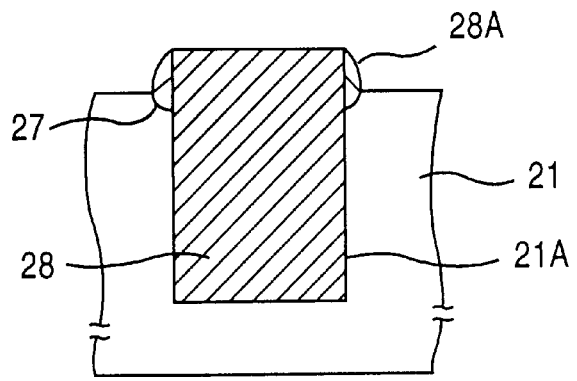
Figure 5:
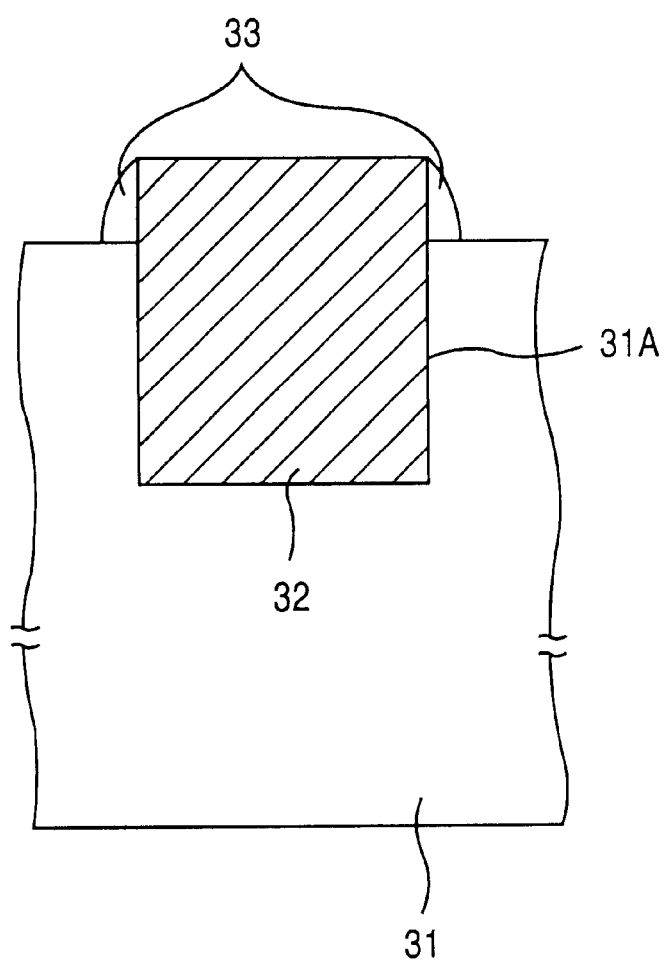
FIG. 5 is a diagram showing an example of an STI structure according to a further related art.

Referring to FIG. 8, the gate electrode 14A extends on the $SiO_2$ film 46A over the rounded steps corresponding to the stepped parts 46b and 46c, and because of this, no acute angle is formed in the $SiO_2$ film 46A. Thus, the problem of decrease of the threshold voltage of the MOS transistor caused by the concentration of the electric field is avoided and there appears no kink explained with reference to FIG. 3 in the operational characteristic curve. Further, in view of the fact that upwardly protruding stepped parts 46b and 46c are formed in such a structure, there occurs no problem of etching residue formation even when the gate electrode 14A is formed by a patterning of a polysilicon or amorphous silicon film.

[Second Embodiment]

FIGS. 9A–9D show the fabrication process of a semiconductor device 60 that has an STI structure according to a second embodiment of the present invention, wherein those parts corresponding to the parts described previously are designated by the same reference numerals and the description thereof will be omitted.

Figure 9A:
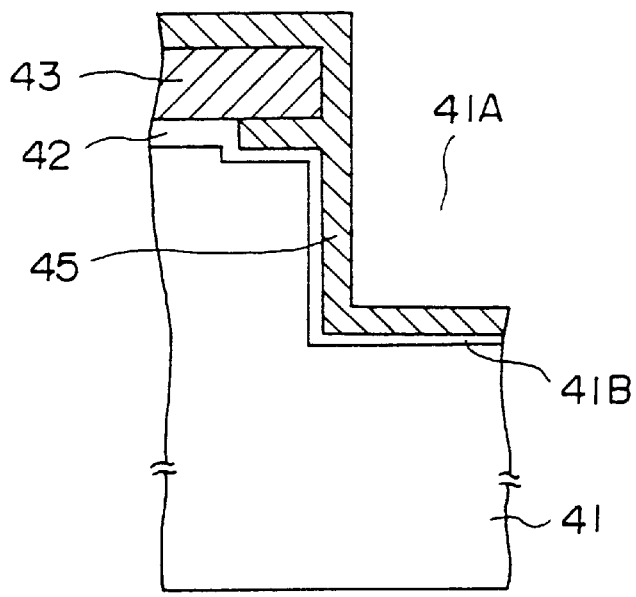
FIGS. 9A–9D are diagrams showing the fabrication process of a semiconductor device according to a second embodiment of the present invention.

FIG. 9A corresponds to the step of FIG. 6C before and the Si layer 45 is formed on the SiN film 43 by a pyrolytic CVD process or a plasma CVD process so as to cover the bottom surface and the sidewall surface of the trench 41A covered by the thermal oxide film 41B and so as to fill the space 42A formed as a result of recession of the initial oxide film 42.

Figure 9B:
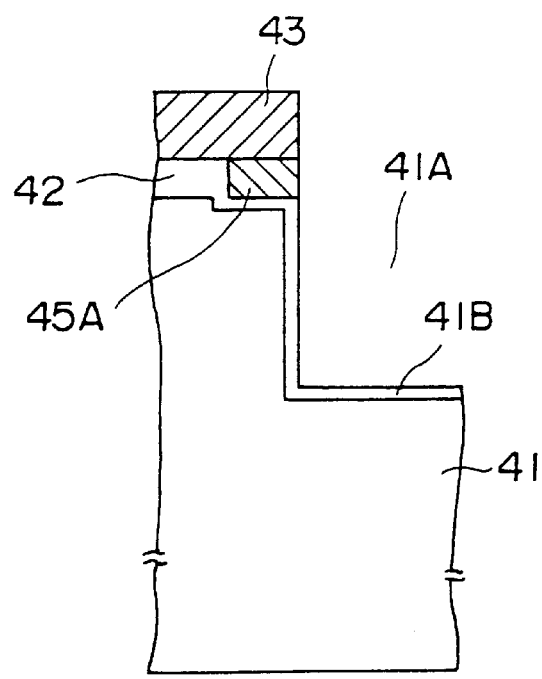

In the present embodiment, the Si layer 45 is removed from the sidewall surface and the bottom surface of the trench 41A in the step of FIG. 9B by an isotropic or anisotropic dry etching process, and thus, the Si layer 45 remains only in the space 42A in the form of a Si pattern 45A.

Figure 9C:
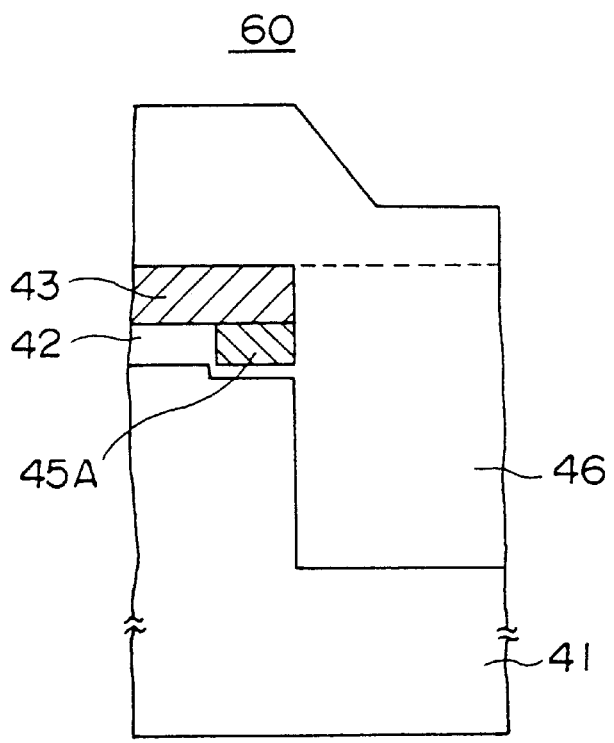

Next, in the step of FIG. 9C, the trench 41A is filled with the $SiO_2$ film 46 and the $SiO_2$ film 46 is polished to the position represented in FIG. 9C by a dotted line while using the SiN film 43 as a polishing stopper.

Figure 9D:
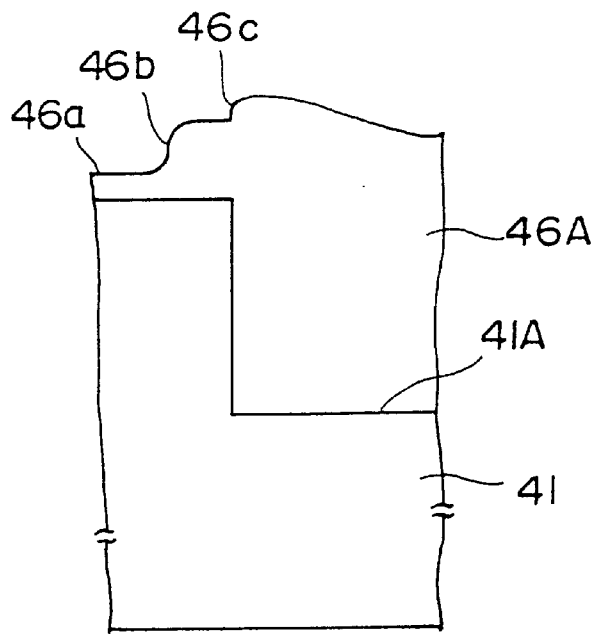

Further, in the step of FIG. 9D, the SiN film 43 and the underlying initial oxide film 42 are etched away respectively in a pyrolytic phosphoric acid solution and in HF, and the Si pattern 45A is changed to $SiO_2$ by conducting an oxidation process in an atmosphere of $O_2$+HCl at 900° C. or in a dry oxygen atmosphere at 1000° C. As a result, the $SiO_2$ film 46A having the stepped parts 46b and 46c is formed such that the $SiO_2$ film 46A fills the trench 41A. In the present embodiment, no Si layer remains in the trench 41A.

Figure 10:
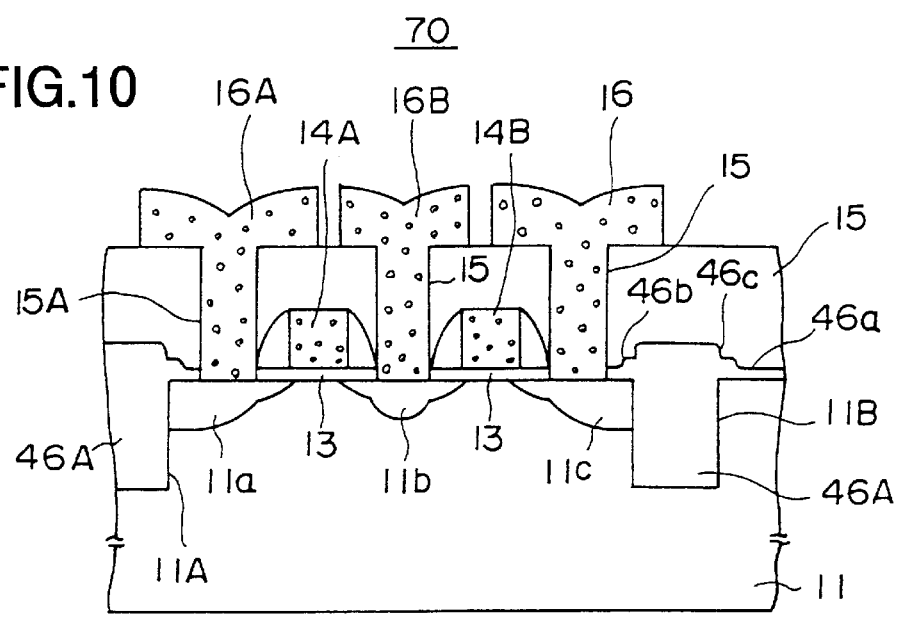
FIG. 10 is a diagram showing the construction of a semiconductor device according to a second embodiment of the present invention.

FIG. 10 shows the construction of a semiconductor device 70 that uses the STI structure of FIG. 9D, wherein those parts of FIG. 10 explained before are designated by the same reference numerals and the description thereof will be omitted.

Referring to FIG. 10, the $SiO_2$ film 46A forming the STI structure of the semiconductor device 70 is formed with stepped parts similarly to the case of the $SiO_2$ film 46A of the semiconductor device 50 of FIG. 7, wherein there occurs no formation of residual Si pattern 45 contrary to the case of the semiconductor device 50.

Figure 11:
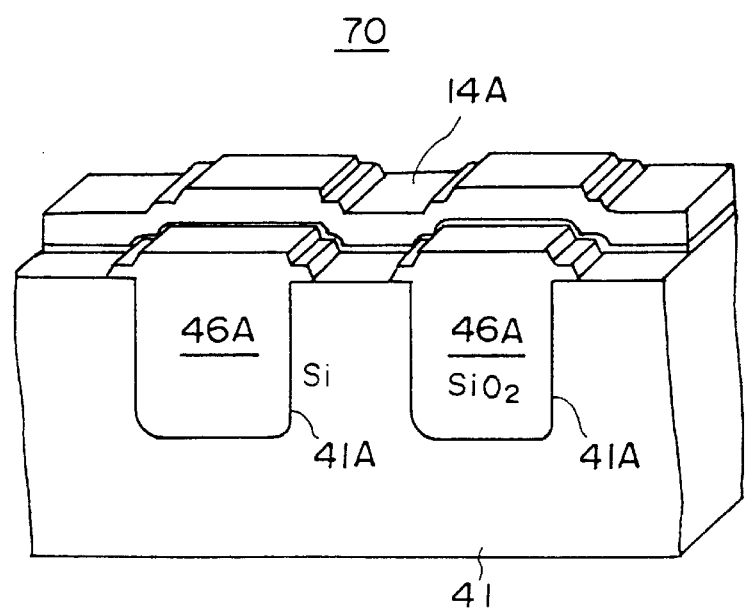
FIG. 11 is a diagram showing a part of the semiconductor device of FIG. 10 in an enlarged scale.

FIG. 11 is a partial enlarged view showing a part of the semiconductor 70 corresponding to FIG. 8.

Referring to FIG. 11, the $SiO_2$ film 46A has the stepped parts similar to the stepped parts of FIG. 8 and the problem of decrease of the threshold voltage of the MOS transistor caused by the concentration of electric field is reduced even when the gate electrode 14 is formed to extend thereon. Further, no polysilicon pattern or amorphous silicon pattern is included in the $SiO_2$ film 46A in the trench 41A in the semiconductor device 70.

Further, the present invention is not limited to the specific embodiments described heretofore but various variations and modifications may be made within the subject matter described in attached claims.

INDUSTRIAL APPLICABILITY

According to the present invention, in a semiconductor device having an STI structure, the device isolation trench constituting the STI structure is filled by an $SiO_2$ film such that the $SiO_2$ film extends over the surface of the substrate to an outer side of the device isolation trench and such that the $SiO_2$ film projects slightly in the upward direction from the substrate surface. By doing so, there occurs no electric field concentration in the $SiO_2$ film even when a gate electrode extends over the $SiO_2$ film and the problem of change of the threshold voltage is avoided. Further, the present invention does not include a dry etching process for etching back the substrate surface, and thus, there occurs no problem of contamination of the substrate surface by impurities. Further, the $SiO_2$ film has an upwardly convex shape in the device isolation trench, and the problem of residue formation of polysilicon pattern or amorphous silicon pattern in the depressed part of the $SiO_2$ film, which tends to appear in a conventional STI structure, is eliminated.

What is claimed is:

1. A semiconductor device, comprising:
   a substrate; and
   a device isolation structure formed on said substrate for defining a device region,
   said device isolation structure comprising:
   a trench formed in said substrate; and
   an insulating film filling said trench,
   said insulating film including an extension part extending outwardly from an outer edge of said trench on a surface of said substrate, a first projecting part projecting upwardly from said extension part in correspondence to said outer edge of said trench, and a second projecting part in correspondence to a sidewall surface of said trench,
   said trench being defined by the sidewall surface forming a non-acute angle with respect to said surface of said substrate extending outside said trench.

2. A semiconductor device as claimed in claim 1, wherein each of said extension part and said projecting part is defined by a stepped part.

3. A semiconductor device as claimed in claim 2, wherein said extension part itself has a stepped part.

4. A semiconductor device as claimed in claim 1, wherein said trench is defined by a sidewall surface substantially perpendicular to a principal surface of said substrate.

5. A semiconductor device as claimed in claim 1, wherein said trench includes a polysilicon pattern in the state embedded in said insulating film.

6. A method of fabricating a semiconductor device having a shallow trench device isolation structure, comprising the steps of:

forming a first oxide film on a Si substrate;

forming a polishing stopper layer on said first oxide film;

forming a trench through said polishing stopper layer and further through said first oxide film such that said trench reaches said Si substrate;

etching said first oxide film exposed at said trench to as to cause a recession in a sidewall surface of said first oxide film with respect to a sidewall surface of said trench, such that there is formed a space between a top surface of said Si substrate and a bottom surface of said polishing stopper layer such that said space is opened at said sidewall of said trench;

oxidizing said sidewall surface and a bottom surface of said trench to form a second oxide film such that said second oxide film covers said top surface of said Si substrate exposed by said space in continuation with said first oxide film;

depositing a Si film on said polishing stopper layer such that said Si film covers said second oxide film and such that said Si film fills said space;

depositing a third oxide film on said Si film so as to fill said trench;

removing said third oxide film and said Si film underlying said third oxide film by a chemical mechanical polishing process while using said polishing stopper layer as a stopper;

removing said polishing stopper layer and said first oxide film from said top surface of said Si substrate; and oxidizing said Si film.

7. A method of fabricating a semiconductor device having a shallow trench device isolation structure, comprising the steps of:

forming a first oxide film on a Si substrate;

forming a polishing stopper layer on said first oxide film;

forming a trench through said polishing stopper layer and further through said first oxide film underneath said polishing stopper layer such that said trench reaches said Si substrate;

etching said first oxide film exposed at said trench so as to cause a recession of a sidewall surface of said first oxide film with respect to a sidewall surface of said trench, such that there is formed a space between a top surface of said Si substrate and a bottom surface of said polishing stopper such that said space is opened at said sidewall surface of said trench;

oxidizing said sidewall surface and a bottom surface of said trench to form a second oxide film such that said second oxide film covers said sidewall surface and said bottom surface of said trench and said top surface of said Si substrate exposed by said space in continuation with said first oxide surface;

forming a Si film in said trench such that said Si film fills said space;

depositing a third oxide film so as to fill said trench;

removing said third oxide film by a chemical mechanical polishing process while using said polishing layer as a stopper;

removing said polishing stopper layer and said first oxide film from said top surface of said Si substrate; and oxidizing said Si film.

8. A method of fabricating a semiconductor device comprising a device isolation trench formed in a substrate and an insulating film filling said device isolation trench, comprising the steps of:

causing a recession in an oxide film formed on a surface of said substrate with regard to a sidewall surface of said device isolation trench at an edge of said device isolation trench, to form a space;

forming a Si film so as to fill said space;

removing said oxide film from said surface of said substrate while leaving said Si film;

filling said trench by an oxide film; and oxidizing said Si film to form an oxide film as a part of said oxide film.

9. A method of forming a device isolation structure comprising a device isolation trench formed in a substrate and an insulating film filling said device isolation trench, said method comprising the steps of:

causing a recession in an oxide film formed on a surface of said substrate with respect to a sidewall surface of said device isolation trench at an edge of said device isolation trench, to form a space;

forming a Si film so as to fill said space;

removing said oxide film from said top surface of said substrate while leaving said Si film;

filling said trench by an oxide film; and oxidizing said Si film to form an oxide film as a part of said oxide film.

10. A semiconductor device, comprising:

a substrate; and a device isolation structure formed on said substrate for defining a device region, said device isolation structure comprising:

a trench formed in said substrate; and an insulating film filling said trench, said insulating film including an extension part extending outwardly from an outer edge of said trench on a surface of said substrate, and a projecting part projecting upwardly from said extension part in correspondence to said outer edge of said trench, said device isolation structure further comprising a polysilicon film embedded in said insulation film filling said trench, such that said polysilicon film extends continuously and in conformity along a sidewall surface and a bottom surface of said trench.

11. A semiconductor device as claimed in claim 10, wherein said polysilicon film extends with a generally uniform thickness.

* * * * *